(12) United States Patent
Kley

(10) Patent No.: US 7,675,079 B1
(45) Date of Patent: Mar. 9, 2010

(54) DIAMOND COATING OF SILICON-CARBIDE LEDS

(76) Inventor: Victor B. Kley, 1119 Park Hills Dr., Berkeley, CA (US) 94708-1715

( * ) Notice: Subject to any disclaimer, the term of this patent is extended or adjusted under 35 U.S.C. 154(b) by 0 days.

(21) Appl. No.: 11/261,458

(22) Filed: Oct. 27, 2005

Related U.S. Application Data

(60) Provisional application No. 60/623,283, filed on Oct. 28, 2004.

(51) Int. Cl.
*H01L 33/00* (2006.01)
(52) U.S. Cl. .............................. 257/98; 257/74; 257/79; 257/94; 257/95; 257/E33.013; 257/E33.015; 257/E33.036; 257/E33.061
(58) Field of Classification Search .................. 257/79, 257/74, 94, 95, 98, E33.013, E33.015, E33.016, 257/E33.036, E33.06, E33.061, E33.068, 257/E33.074; 438/33, 34, 35, 25–29
See application file for complete search history.

(56) References Cited

U.S. PATENT DOCUMENTS

| 4,030,317 | A | | 6/1977 | Rogell | |
|---|---|---|---|---|---|
| 4,396,677 | A | | 8/1983 | Intrater et al. | |
| 4,837,089 | A | | 6/1989 | Araki et al. | |
| 4,863,529 | A | | 9/1989 | Imai et al. | |
| 4,981,818 | A | | 1/1991 | Anthony et al. | |
| 5,354,717 | A | | 10/1994 | Pollock et al. | |
| 5,365,345 | A | | 11/1994 | Propst et al. | |
| 5,560,716 | A | | 10/1996 | Tank et al. | |
| 5,777,433 | A | * | 7/1998 | Lester et al. ................. | 313/512 |
| 5,813,753 | A | * | 9/1998 | Vriens et al. ................. | 362/293 |
| 6,155,699 | A | * | 12/2000 | Miller et al. ................. | 362/293 |
| 6,274,890 | B1 | * | 8/2001 | Oshio et al. ................... | 257/98 |
| 6,366,018 | B1 | * | 4/2002 | Garbuzov et al. ............ | 313/542 |
| 6,466,135 | B1 | * | 10/2002 | Srivastava et al. ......... | 340/815.4 |
| 6,497,763 | B2 | * | 12/2002 | Kub et al. ...................... | 117/94 |
| 6,600,175 | B1 | * | 7/2003 | Baretz et al. ................. | 257/100 |
| 6,642,652 | B2 | * | 11/2003 | Collins et al. ............... | 313/512 |
| 6,791,259 | B1 | * | 9/2004 | Stokes et al. ................. | 313/503 |
| 2003/0102473 | A1 | * | 6/2003 | Chason et al. ................. | 257/43 |
| 2003/0168663 | A1 | * | 9/2003 | Slater et al. .................... | 257/77 |
| 2004/1005626 | | * | 3/2004 | Slater et al. .................... | 257/79 |
| 2005/0023545 | A1 | * | 2/2005 | Camras et al. ................. | 257/98 |
| 2005/0224829 | A1 | * | 10/2005 | Negley et al. ................. | 257/99 |

OTHER PUBLICATIONS

Morkoc, large-band-gap SiC, III-V nitride, and II-VI ZnSe based semiconductor device technologies, J. Appl. Phys. 76, 1363-1365, 1994.*
Stoldt, C.R., et al., "Novel Low-Temperature CVD Process for Silicon Carbide MEMS," Department of Chemical Engineering, Univ of CA, Berkley, CA 94720 p. 1-4.
May, Paul W., "CVD Diamond—a New Technology for the Future?", School of Chemistry, University of Bristol, Bristol BS8 1TS, UK, Downloaded on May 11, 2009 from www.tlchm.bris.ac.uk/pt/diamond/end.htm. Reprint of article originally found in *Endeavor Magazine*, 1995, vol. 19, No. 3, pp. 101-106.

* cited by examiner

*Primary Examiner*—Kiesha R. Bryant
*Assistant Examiner*—Minchul Yang
(74) *Attorney, Agent, or Firm*—Townsend and Townsend and Crew LLP

(57) ABSTRACT

In silicon-carbide based light emitting diodes (LEDs) and other similar applications, diamond crystals are used to provide an intermediate refractive index that permits more of the ultraviolet light generated in the diode to reach the phosphors, producing a brighter light with greater efficiency.

11 Claims, 1 Drawing Sheet

DIAMOND COATING OF SILICON-CARBIDE LEDS

CROSS-REFERENCES TO RELATED APPLICATIONS

This application claims the benefit of U.S. Provisional Application No. 60/623,283, filed Oct. 28, 2004, entitled "Diamond and/or Silicon Carbide Forming of Small and Microscale or Nanoscale Capsules and Hohlraums," which disclosure is incorporated herein by reference for all purposes.

The present disclosure is related to the following commonly-assigned co-pending U.S. Patent Applications:
  application Ser. No. 11/067,517, filed Feb. 25, 2005, entitled "Diamond Capsules and Methods of Manufacture"; and
  application Ser. No. 11/067,609, filed Feb. 25, 2005, entitled "Apparatus for Modifying and Measuring Diamond and Other Workpiece Surfaces with Nanoscale Precision."

The respective disclosures of these applications are incorporated herein by reference for all purposes.

BACKGROUND OF THE INVENTION

The present invention relates in general to light coupling, and in particular to diamond and/or silicon carbide coatings applied to light-emitting diodes.

Light-emitting diodes (LEDs) are known in the art and can be made of various materials that radiate light at different wavelengths. For example, ultraviolet light (UV) can be produced by diodes fabricated from silicon carbide using conventional techniques. Where visible light is desired, phosphors that radiate visible light of a desired wavelength in response to the incident UV are placed in contact with the silicon carbide diode. Such diodes and LEDs are used in numerous applications.

Existing silicon carbide diodes convert a large percentage of the UV they generate back into heat because of the high index of refraction of silicon carbide (2.7) as compared to air(1), plastic(1.1) or in-contact phosphors(1.2-0.4). The large index difference results in UV being reflected back into the silicon carbide, heating it This effect limits the efficiency of silicon carbide diodes.

It would therefore be desirable to provide silicon carbide LEDs with higher efficiency.

BRIEF SUMMARY OF THE INVENTION

The present invention relates to coupling light from a very high index of refraction material such as silicon carbide (index about 2.7) to a lower index material such as plastic (index about 1.1), glass or quartz (index about 1.4), or air (index about 1). In some embodiments, the invention relates to coupling ultraviolet light produced in a silicon carbide (SiC) light emitting diode (LED) to phosphors located on or adjacent to the diode, which in turn give off any mixture of colors including white (sufficient amounts of red, green and blue so as to appear white). In such diodes and other similar applications, diamond can be used to provide a region of intermediate refractive index (diamond index is 2.4) to permit much more of the UV light to reach the phosphors and thus produce a brighter light with greater efficiency. Further since UV light production in SiC is associated with heat generation the diamond coating provides a means for cooling the SiC substrate.

In one embodiment, CVD diamond crystals in size from a nanometer to a few microns are grown on the SiC substrate before the phosphor coating is applied thereto. These diamond crystals serve both to couple the UV light out of the SiC substrate; in addition, because the crystals form a rough surface they increase the surface area on which the phosphor is coating again increasing the total light output of the result.

The following detailed description together with the accompanying drawing will provide a better understanding of the nature and advantages of the present invention.

DETAILED DESCRIPTION OF THE INVENTION

Figure 1:
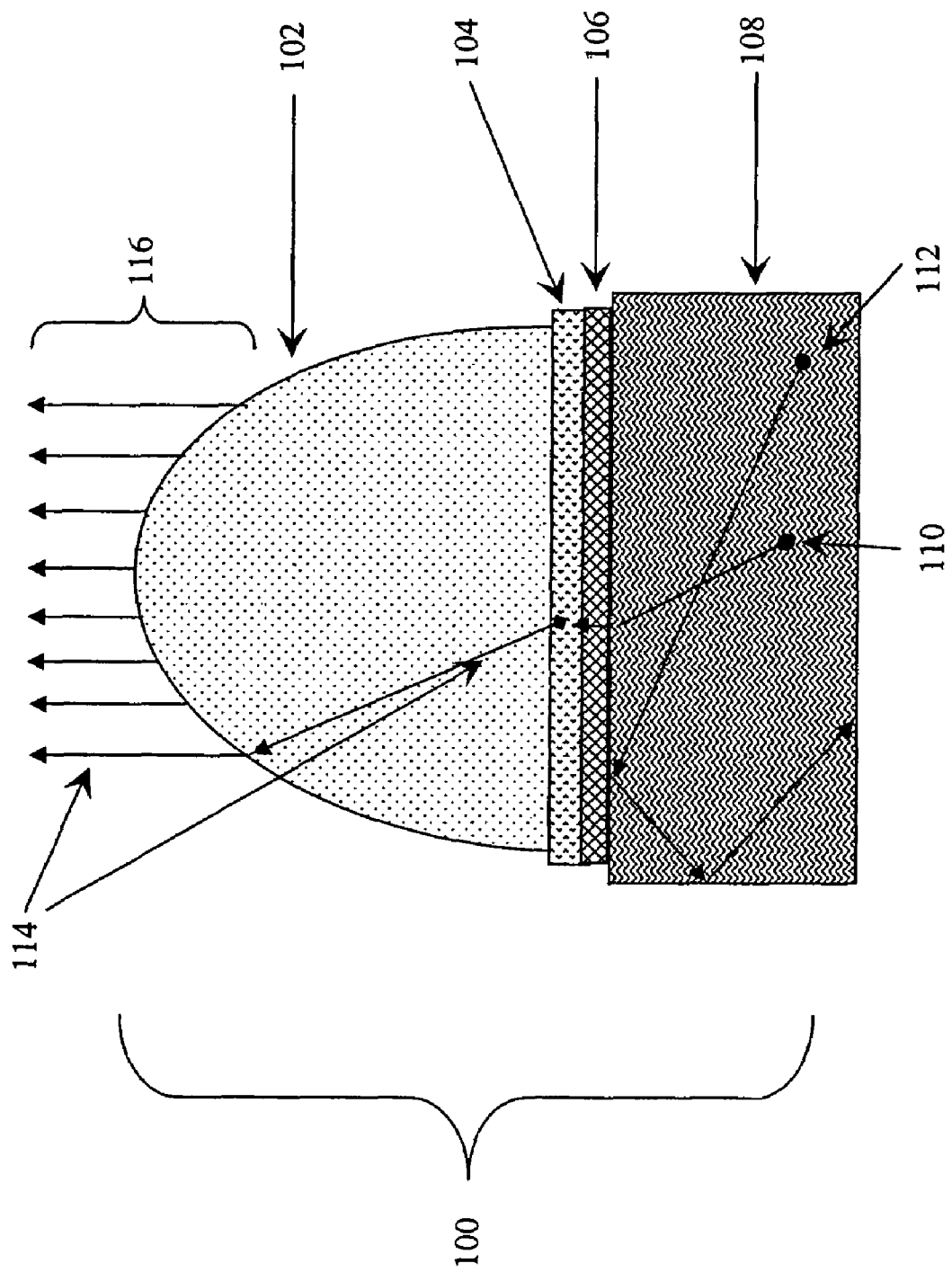
FIG. 1 is a side view of a SiC LED apparatus 100 according to an embodiment of the present invention.

In accordance with an embodiment of the present invention, a single crystal silicon carbide (SiC) LED can be used with a diamond coating to index-match it such that UV light otherwise trapped by total internal reflection can escape into the diamond coating, where it can readily interact with visible-light-producing phosphors to substantially increase the efficiency of the SiC-based LED.

"Diamond," as used herein, refers generally to any material having a diamond lattice structure on at least a local scale (e.g., a few nanometer), and the material may be based on carbon atoms, silicon atoms, or any other atoms capable of forming a diamond lattice. The diamond coating may be made of any type of diamond material, including crystalline, polycrystalline (ordered or disordered), nanocrystalline and amorphous diamond. In some embodiments, small (nanometer to micrometer) diamond crystals are used for the coating.

In some embodiments, silicon nitride may be used to further reduce by steps the index of refraction of the system to couple more UV from the SiC. Any number of additional decreasing or increasing index materials may be coated onto the device to optimally match any material (including phosphors or some particular object targeted for exposure to the UV light) to the output of the SiC UV source.

FIG. 1 is a side view of a SiC LED apparatus 100 according to an embodiment of the present invention. A SiC crystal diode 108 is coated with diamond crystals 106 and a phosphor layer 104. A lens 102, which may be made of plastic or other material, covers phosphor layer 104 and collimates the light emitted from phosphor layer 104.

Diamond crystals 106 may be formed using chemical vapor deposition (CVD) or other known techniques for growing or depositing diamond crystals on a surface, and the crystals may range in size from a nanometer to tens of microns or more. In some embodiments, diamond crystals 106 form a microscopically rough surface, and this roughness increases the contact area between diamond crystals 106 and phosphor layer 104.

Phosphor layer 104 contains phosphors (including any conventional phosphorescent material) that radiate light of a desired wavelength when stimulated by UV light.

Lens 102 may also be of generally conventional design and may focus, defocus, or otherwise direct the light.

In operation, crystal diode 108 generates UV light rays 110, 112. Ray 112 strikes the surface of diode 108 at a large angle and is internally reflected. Ray 110 strikes the surface at a smaller angle and passes through to diamond coating 106, which refracts ray 110 toward normal so that it can cross into phosphor layer 104. Ray 110 is absorbed in phosphor layer 104, which radiates visible light 114 into lens 102. Lens 102 refracts light ray 114 to collimate it with other light rays (not explicitly shown) generated in phosphor layer 104 to form a visible light beam 116.

Those skilled in the art will appreciate that diamond crystals 106 reduce the difference in index of refraction at the boundary layer between SiC diode 108 and phosphor layer 104. This reduces the amount of total internal reflection in SiC diode 108, allowing more light rays to enter phosphor layer 104. The result is higher efficiency: at the same power consumption, more light is generated, or the same light can be generated at lower power consumption. Since more of the input energy is converted to light, heat generation is also produced.

Further, to the extent that the top surface of diamond layer 106 is rougher than the top surface of SiC diode 108, diamond layer 106 increases the contact area through which light can enter phosphor layer 104. This can further increase the total light output of apparatus 100.

While the invention has been described with respect to specific embodiments, one skilled in the art will recognize that numerous modifications are possible. For instance, the diamond coatings described herein may also be applied to other crystal LEDs. Other index-matching coatings may also be used in conjunction with the diamond coating.

One skilled in the art will also recognize that the invention provides a number of advantageous techniques, tools and products, usable individually or in various combinations. These techniques, tools, and products include but are not limited to:

- a light-emitting or light-coupling device in which diamond is used to create an intermediate step in the index of refraction from a high index region (higher than diamond) to a lower index region (lower than diamond); and/or
- a light-emitting or light-coupling device that uses diamond to create an intermediate index region in which the thermal properties of diamond are used to improve the power output or reduce the operating temperature of the device; and/or
- a light-emitting or light-coupling device that uses diamond to create an intermediate index region in which the insulating and/or conducting properties of diamond are used isolate and/or electrically connect device regions and outside sensors or supplies; and/or
- a SiC LED in which a diamond coating is used to couple UV light out of the LED and increase the efficiency with which such light is coupled to phosphors; and/or
- an SiC LED with a diamond coating as described above in which silicon nitride is used to create a further reduced index of refraction for coupling UV from the SiC LED; and/or
- an SiC LED with a diamond coating as described above in which any number of coatings are used to reduce by steps the index of refraction so as to match that of the material to be coupled to the LED UV such as a phosphor.

Thus, although the invention has been described with respect to specific embodiments, it will be appreciated that the invention is intended to cover all modifications and equivalents within the scope of the following claims.

What is claimed is:

1. A silicon-carbide-based LED comprising:
   a silicon carbide crystal diode adapted to generate light;
   a diamond coating grown on a surface of the silicon carbide crystal diode, the diamond coating consisting of diamond; and
   a phosphor layer disposed such that the diamond coating is between the silicon carbide crystal and at least a portion of the phosphor layer,
   wherein the diamond coating provides a region having an index of refraction intermediate between an index of refraction of the silicon carbide crystal diode and an index of refraction of the phosphor layer.

2. The LED of claim 1, further comprising:
   a silicon nitride layer disposed between the diamond coating and the phosphor layer,
   wherein the silicon nitride layer has a further reduced index of refraction relative to the diamond layer.

3. The LED of claim 1 further comprising:
   at least one coating layer disposed between the diamond coating and the phosphor layer;
   wherein materials and arrangement of the coating layers reduce by steps the index of refraction so as to match that of the phosphor layer.

4. The LED of claim 1 wherein the diamond coating comprises a plurality of diamond crystals.

5. The LED of claim 4 wherein the diamond crystals have an average size in a range from about 1 nanometer to about 10 microns.

6. The LED of claim 1 wherein thermal properties of diamond are used to improve power consumption or reduce an operating temperature of the device.

7. The LED of claim 1 wherein electrical properties of diamond are used to isolate device regions from or to electrically connect device regions with outside sensors or power supplies.

8. The LED of claim 1 wherein the diamond coating consists essentially of polycrystalline diamond.

9. The LED of claim 1 wherein the diamond coating consists essentially of nanocrystalline diamond.

10. A silicon-carbide-based LED for directing light to a target, the LED comprising:
    a silicon carbide crystal diode adapted to generate light; and
    a diamond coating grown on a surface of the silicon carbide crystal diode, wherein the diamond coating consists of a plurality of diamond crystals, each of the plurality of diamond crystals having a size of 1 nanometer or greater,
    wherein the diamond coating provides a region having an index of refraction intermediate between an index of refraction of the silicon carbide crystal diode and an index of refraction of an intended target of light produced by the LED.

11. The LED of claim 10 wherein the diamond crystals are grown using a chemical vapor deposition process.

* * * * *